US009337131B2

(12) United States Patent
Huo et al.

(10) Patent No.: US 9,337,131 B2
(45) Date of Patent: May 10, 2016

(54) POWER SEMICONDUCTOR DEVICE AND THE PREPARATION METHOD (71) Applicant: Alpha and Omega Semiconductor (Cayman) Ltd., Sunnyvale, CA (US)

(72) Inventors: Yan Huo, Shanghai (CN); Hamza Yilmaz, Saratoga, CA (US); Jun Lu, San Jose, CA (US); Ming-Chen Lu, Shanghai (CN); Zhi Qiang Niu, Santa Clara, CA (US); Yan Xun Xue, Los Gatos, CA (US); Demei Gong, Shanghai (CN)

(73) Assignee: Alpha and Omega Semiconductor (Cayman) Ltd., Sunnyvale, CA (US)

( * ) Notice: Subject to any disclaimer, the term of this patent is extended or adjusted under 35 U.S.C. 154(b) by 0 days.

(21) Appl. No.: 14/500,982

(22) Filed: Sep. 29, 2014

(65) Prior Publication Data
US 2016/0093560 A1    Mar. 31, 2016

(51) Int. Cl.
H01L 23/495    (2006.01)
H01L 23/00     (2006.01)
H01L 23/31     (2006.01)
H01L 21/56     (2006.01)
H01L 21/78     (2006.01)
H01L 21/48     (2006.01)
H01L 21/3213   (2006.01)
H01L 21/3105   (2006.01)

(52) U.S. Cl.
CPC .... H01L 23/49541 (2013.01); H01L 21/31053 (2013.01); H01L 21/3213 (2013.01); H01L 21/4842 (2013.01); H01L 21/565 (2013.01); H01L 21/78 (2013.01); H01L 23/3107 (2013.01); H01L 23/49513 (2013.01); H01L 24/11 (2013.01); H01L 24/14 (2013.01); H01L 24/32 (2013.01); H01L 24/73 (2013.01); H01L 24/83 (2013.01); H01L 24/97 (2013.01); H01L 2224/1184 (2013.01); H01L 2224/32245 (2013.01); H01L 2224/73153 (2013.01); H01L 2924/01013 (2013.01); H01L 2924/05432 (2013.01)

(58) Field of Classification Search
None
See application file for complete search history.

(56) References Cited

U.S. PATENT DOCUMENTS

| | | | | |
|---|---|---|---|---|
| 3,686,625 A * | 8/1972 | Krehbiel, Sr. | ........ | B23K 35/224 174/263 |
| 4,789,914 A * | 12/1988 | Ainslie | ................ | G11B 5/3103 360/234.4 |
| 2002/0093093 A1 * | 7/2002 | Paek | .................... | H01L 23/3107 257/723 |
| 2002/0155642 A1 * | 10/2002 | Noquil | ................ | H01L 21/4853 438/125 |
| 2011/0068457 A1 * | 3/2011 | Zhang | ............... | H01L 23/49513 257/692 |
| 2014/0264805 A1 * | 9/2014 | Ho | .......................... | H01L 21/78 257/676 |

* cited by examiner

Primary Examiner — Shaun Campbell
Assistant Examiner — Aneta Cieslewicz
(74) Attorney, Agent, or Firm — Chein-Hwa S. Tsao; Chen-Chi Lin (57) ABSTRACT An ultrathin power semiconductor package with high thermal dissipation performance and its preparation method are disclosed. The package includes a lead frame unit with a staggered structure including an upper section and a lower section. A thin layer is attached on the surface of the lead frame unit having a plurality of contact holes on the upper section and at least one opening on the lower section. A semiconductor chip is attached on the opening on the lower section of the lead frame unit and then a plurality of metal bumps are deposited, where one metal bump is formed on each contact hole on the upper section and on each of the electrodes on the top surface of the semiconductor chip.

6 Claims, 9 Drawing Sheets

POWER SEMICONDUCTOR DEVICE AND THE PREPARATION METHOD

FIELD OF PRESENT INVENTION

The present invention relates to a power semiconductor package, more specifically, an ultra thin semiconductor package with high thermal dissipation performance, and the method of preparation.

BACKGROUND OF RELATED ART

Figure 1A:
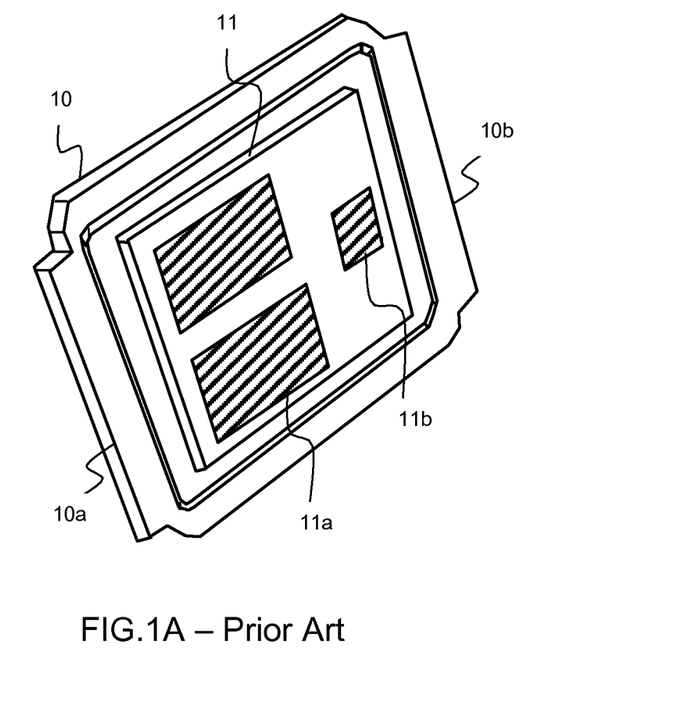
FIGS. 1A-1B are perspective view and cross-sectional view of a conventional DirectFET.
Figure 1B:
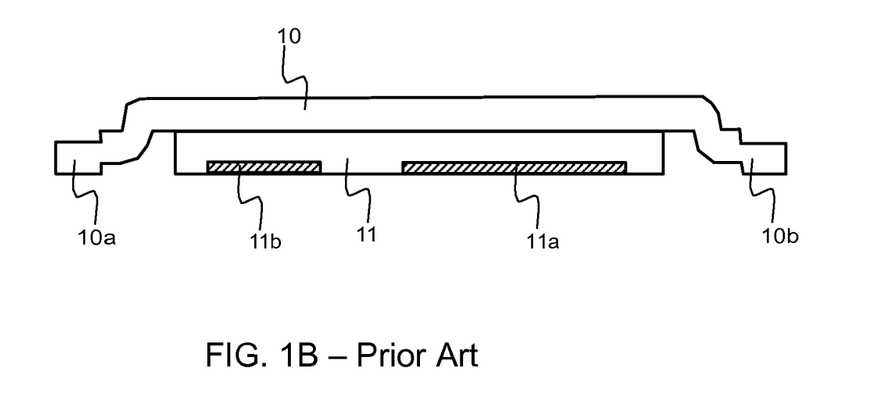

In the application of power transistor, the overall size and thermal dissipation of the final semiconductor device are two important parameters. The thermal performance of the device is improved by exposing part of the electrode of the transistor, but such process is often difficult to control, and the heat dissipation is still poor. FIG. 1A is a conventional DirectFET package, which is disclosed in "DirectFET Technology—Board Mounting Application Note" January 2002—International Rectifier. Such packages are suitable for industrial applications that require extremely low conduction resistance RDSon, such as high-power DC motors, DC/AC inverter, as well as dynamic ORing hot-swap, electrical fuses and other high current switching applications. As shown in FIGS. 1A-1B, the DirectFET package includes a metal can 10 with the leads 10a and 10b extended horizontally at two opposite edges. A MOSFET 11 is mounted in the metal can 10, where a drain electrode at the back of the MOSFET 11 is directly attached to the metal can 10, while the top surfaces of the source electrode 11a and the gate electrode 11b on the front of the MOSFET 11 are coplanar with the top surfaces of the leads 10a, 10b of the metal can 10. Thus the source electrode 11a, gate electrode 11b, and two leads 10a and 10b can all be mounted simultaneously on the contact pads on the PCB. The DirectFET package generally has a thickness of less than 0.7 mm, thus provide an ideal solution for the compact-size power supply design in high-power industries.

Figure 2A:
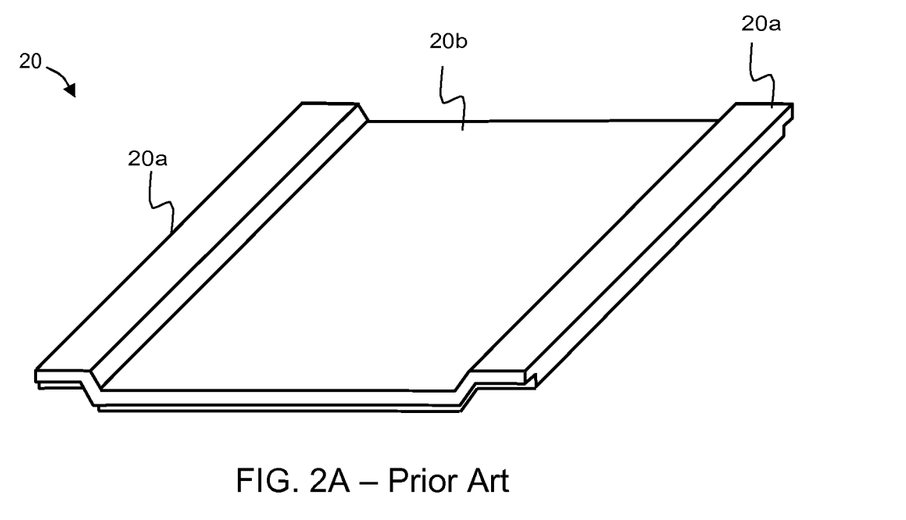
FIGS. 2A-2B are schematic diagrams illustrating a lead frame and a complete package of a conventional X-FET package.
Figure 2B:
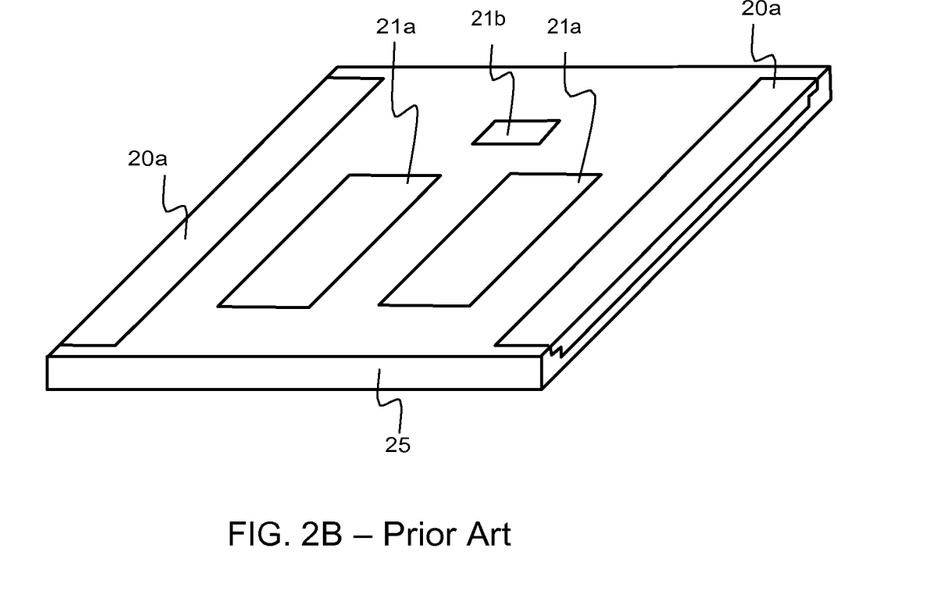

FIGS. 2A-2B illustrate a conventional X-FET semiconductor package. FIG. 2A is a schematic of the lead frame 20 having a die pad 20b with two leads 20a extended horizontally at two opposite edges of the die pad 20b, where the plane of the leads 20a is higher than the plane of the die pad 20b. As shown in FIG. 2B, the bottom electrode of a MOSFET is attached on the die pad 20b, while the top surface of the source electrode 21a and the gate electrode 21b on top of the MOSFET are coplanar with the upper surface of the leads 20a. In FIG. 2B, after the molding is completed, the MOSFET is completely covered by molding layer 25 while the source electrode 21a, the gate electrode 21b and the top surface of the leads 20a are exposed from the molding layer 25 as the electrode terminals.

As shown in FIGS. 1A-1B and 2A-2B, leads 10a, 10b and 20a are on opposite sides of the chip, which results in a larger package size. Furthermore, to satisfy the coplanar condition of the source and gate electrodes at the front of the chip and the top surface of the leads, the thickness of the MOSFET needs to be precisely controlled within a very narrow range, which is a great challenge to the equipment accuracy as well as cost control. In addition, in the package of FIG. 2B, the top surface of the lead 20a is plated with a metallic layer while the gate electrode 21b and the source electrode 21a is protected by a tape that can be peeled after plating is done, as such the manufacturing process is more complicated.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention.

DESCRIPTION OF THE SPECIFIC EMBODIMENTS

Figure 3:
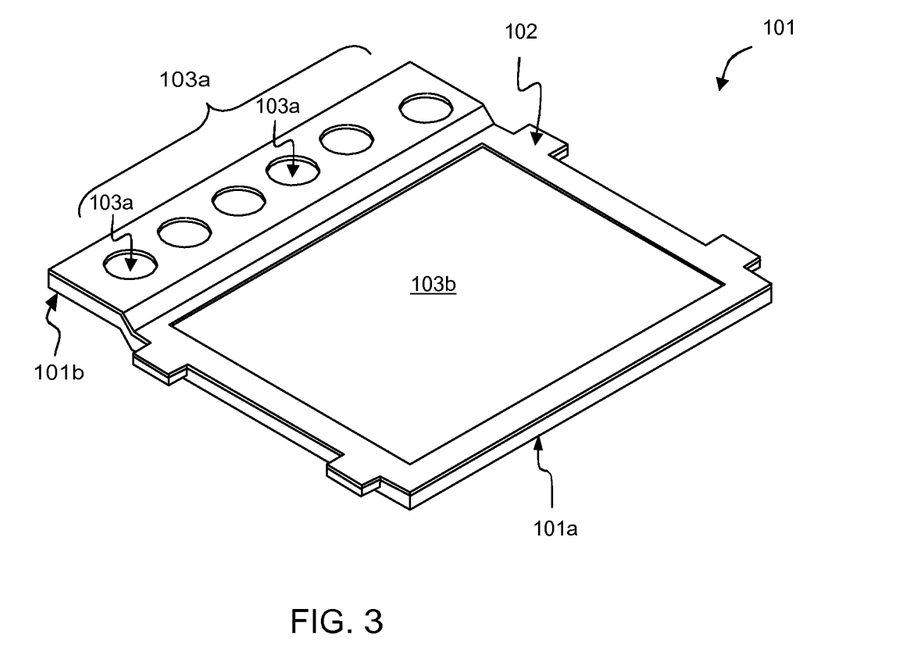
FIG. 3 is aerial perspective view of a lead frame of the present invention.

FIG. 3 shows a lead frame unit 101, which can be made of copper, with its upper surface covered with a thin layer 102. The lead frame unit 101 has a staggered structure including an upper metal section 101b and a lower metal section 101a with their top surfaces being parallel to each other. A plurality of contact holes 103a are formed atop the upper section 101b by etching through the thin layer 102, exposing the metal section 101b. These contacts holes are preferred to be in a straight row. Similarly, an opening 103b is also formed by etching through the thin layer 102 atop the lower metal section 101a exposing the lead frame. Optionally, the opening 103b can be a square shape to accommodate a square chip and the contact holes 103a are circular to accommodate solder balls.

Figure 4A:
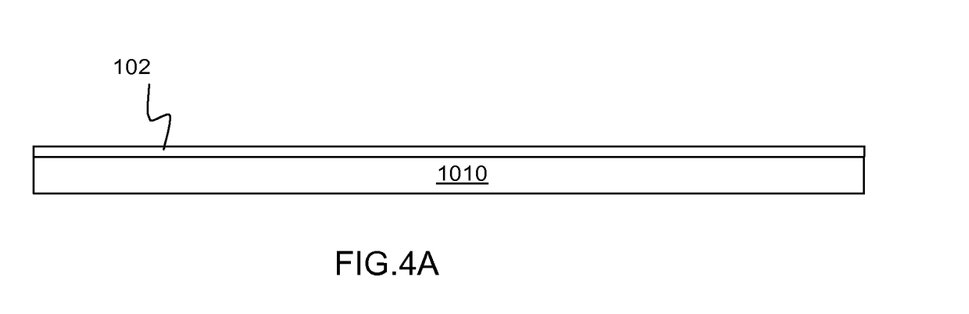
FIGS. 4A-4C show the process of manufacturing a lead frame of FIG. 3 with a thin film layer attached on top.
Figure 4B:
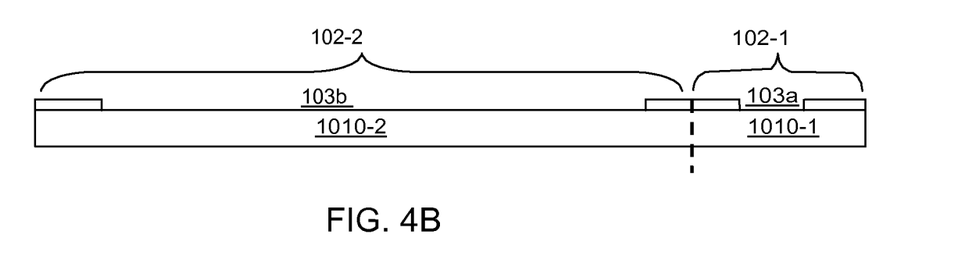
Figure 4C:
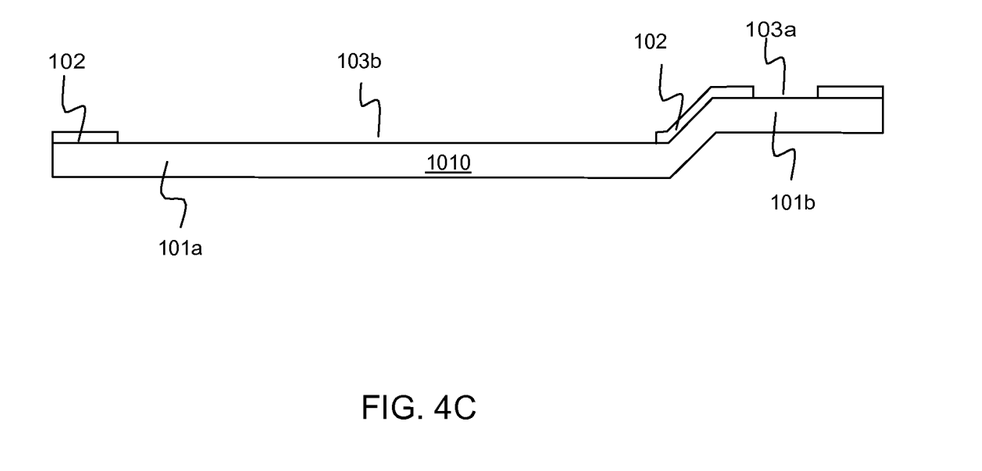

FIGS. 4A-4C show the preparation steps of the lead frame unit 101 of FIG. 3. As shown in FIG. 4A, a flat metal layer 1010 with a thin layer 102 formed on top is provided. The thin layer, which is preferably aluminum, can be formed by plating, sputtering or lamination atop the metal layer 1010. Then a photoresist layer is applied on thin layer 102 (not shown) followed by the etching of the thin layer 102 to form the contact holes 103a in the area 102-1 and the opening 103b in the area 102-2, and then the photoresist layer is removed as shown in FIG. 4B. As shown in FIG. 4C, the metal layer 1010 with the etched layer 102 formed thereon is bent, through punching or stamping, forming an upper section 101b and a lower-set section 101a. With reference to FIGS. 4B-4C, the portion 1010-1 of the metal layer 1010 with the contact holes 103a in the area 102-1 is punched to form the upper section 101b, while the portion 1010-2 of the metal layer 1010 with the opening 103b in the area 102-2 becomes the lower section 101a. The inclined section between the upper section 101b and the lower section 101a is completely covered by thin layer 102. The material used for thin layer 102 needs to be ductile; otherwise crack may result during punching process or at the bend. This will be described in detail later.

Figure 5A:
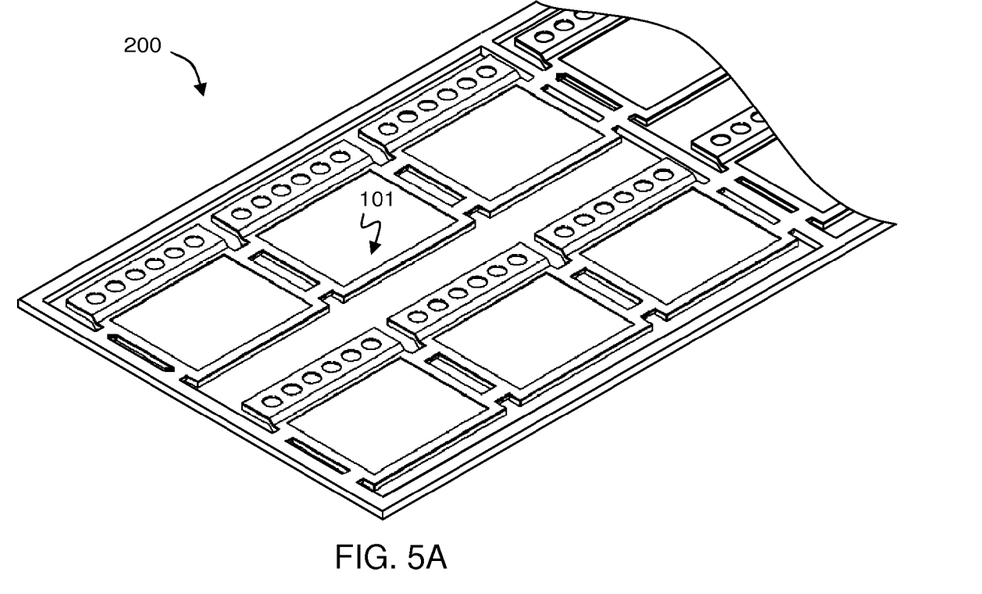
FIGS. 5A-5H show a process for preparing the power semiconductor device of the present invention.
Figure 5B:
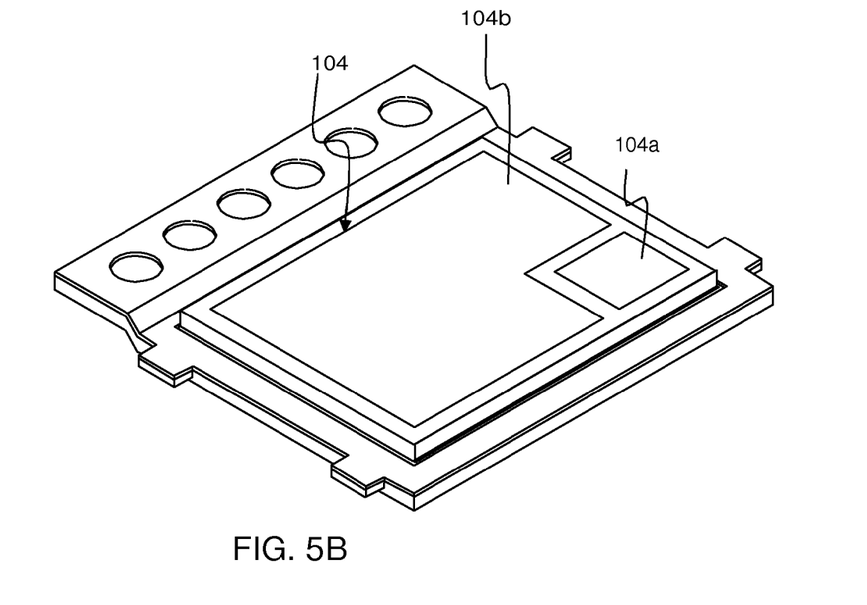
Figure 5C:
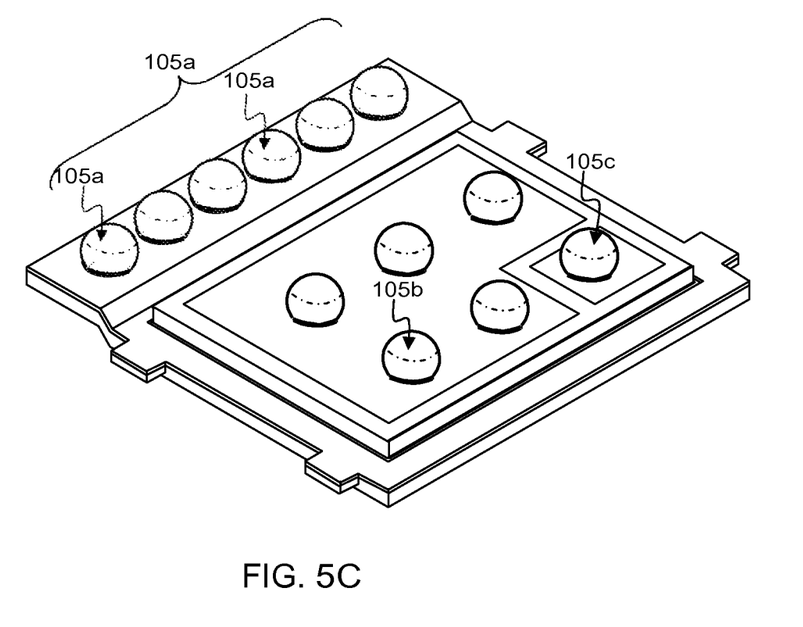

FIG. 5A shows a portion of a lead frame strip 200 comprising a plurality of lead frame units 101 of FIG. 3 connected together. The layout of the lead frame unit 101 on the lead frame strip 200 can be varied, for example the lead frame includes all the lead frame units in the strip oriented in the same way or the lead frame strip includes a plurality of pairs of two adjacent lead frame units arranged as a mirror image of each other. In FIG. 5B, a conductive adhesive material, such as solder paste or silver paste, is applied to the surface of the opening 103b in the lower section 101a (not shown), then a vertical type power MOSFET chip 104 is attached on the opening 103b via the conductive adhesive material, such that the electrode at the bottom of the chip 104, for example drain electrode, is electrically connected to the lead frame unit 101. This step can also be achieved by using an Eutectic soldering. In FIG. 5C, a metal bump 105a are deposited into each of the contact holes 103a on the upper section 101b, a metal bump 105c is deposited on the gate electrode 104a of the MOSFET chip 104 while a plurality of metal bumps 105b are deposited on the source electrode 104b of the same chip. These metal bumps can be made by solder ball drop, solder print or solder dispensed. When solder balls are used, reflow soldering is used for the attachment.

The thin film layer 102 is preferably made of aluminum since solder bumps 105a and 105b generally have better wettability by copper than by aluminum. Hence the metal bumps 105a are formed on the copper surface in the contact holes 103a at the top surface of upper section 101b without wetting and overflowing on the top surface of the aluminum layer 102 surrounding the contact holes 103. Further, the oxidation of the aluminum layer 102 forms a passivation layer that further help preserve the shape of the solder bumps since the solder does not have a good wettability by aluminum oxide. The oxidation occurs at an exposed top surface of the aluminum layer 102. An optional aluminum oxide layer 192 is shown in dashed lines in FIG. 5D. Aluminum is an example of the material used as the thin layer 102; however any metal to which the solder does not have a better wettability than the material of the lead frame can be used for the thin layer.

Figure 5D:
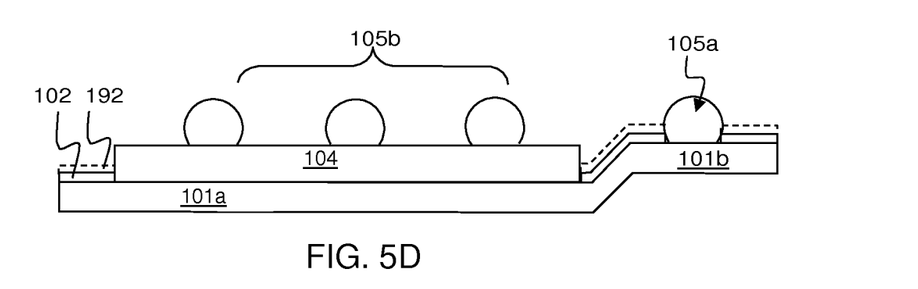
Figure 5E:
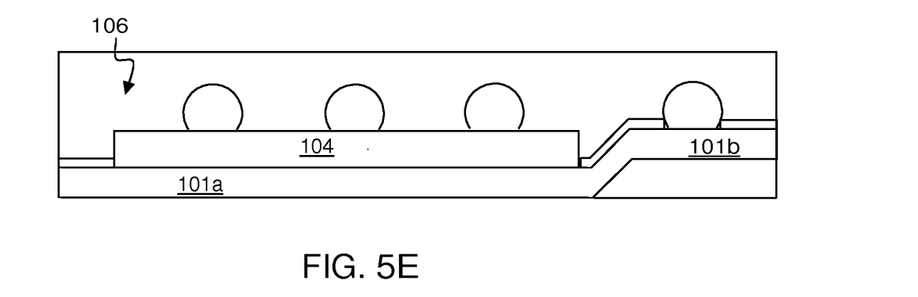

In FIG. 5E, plastic material, such as epoxy resin, is deposited to form a molding layer 106 covering the thin layer 102, the lead frame strip 200 comprising a plurality of lead frame units 101, chips 104, and all the metal bumps 105a, 105b and 105c, while the bottom surface of the lower section 101a is exposed. Material for the thin layer 102 is selected so that its binding strength to the molding layer is stronger than that between the molding layer and the lead frame. Thus when oxidation occurs on the surface of layer 102, its surface is rougher and the bonding strength between the thin layer 102 and the molding layer 106 is even better.

Figure 5F:
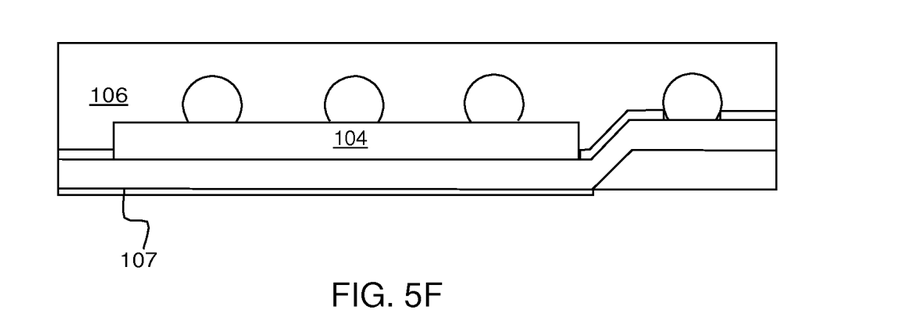
Figure 5G:
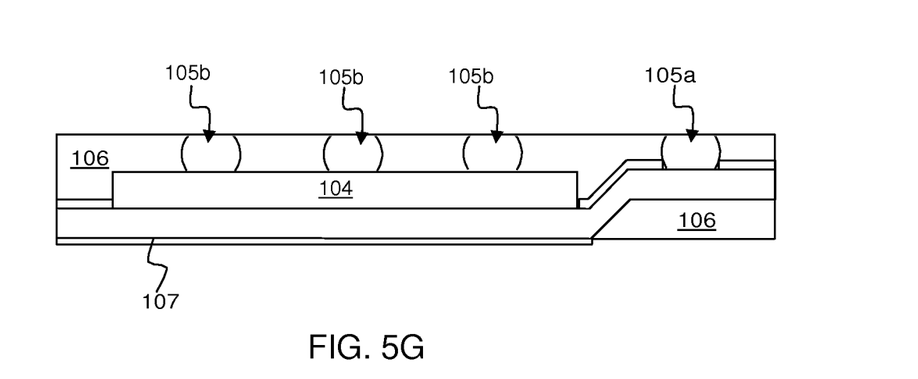
Figure 5H:
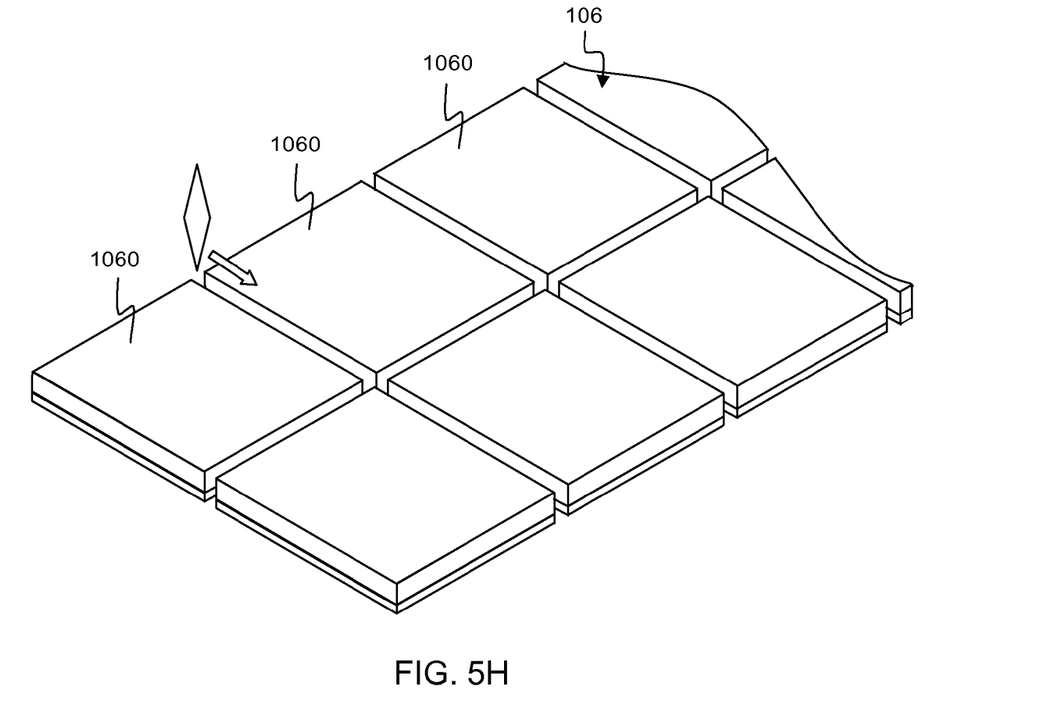

In FIG. 5F, after the molding process, a metal layer 107 is optionally plated on the exposed bottom surface of lower section 101a of every lead frame unit. An example of this step is electroplating of a tin layer. Then, as shown in FIG. 5G, the molding layer and the metal bumps 105a, 105b and 105c are ground from the top until the metal bumps 105a, 105b and 105c are exposed and flushed with the molding layer 106. In FIG. 5H, individual packages 1060 are formed by separating the lead frame units 101 from each other and from the lead frame strip 200. Each package 1060 consists of a lead frame unit 101 with a thin layer 102 formed thereon, a chip 104 attached to the lead frame unit 101, metal bumps 105a, 105b and 105c attached on the chip 104 and the upper section 101b of the lead frame unit and exposed from the molding layer, and the bottom surface of the lower section of the lead frame unit exposed from the molding layer. As mentioned above, the exposed bottom surface is optionally plated with a metal layer 107.

Figure 6A:
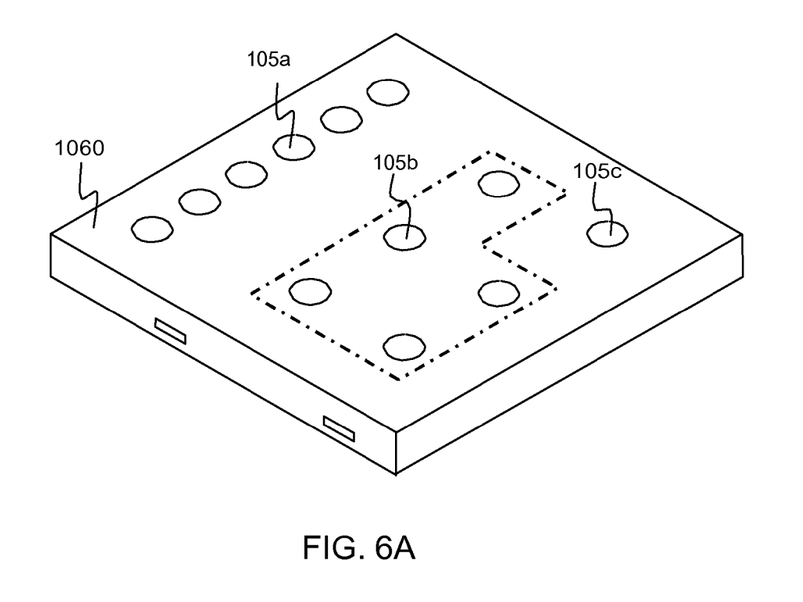
FIGS. 6A-6D show alternative power semiconductor devices of the present invention.
Figure 6B:
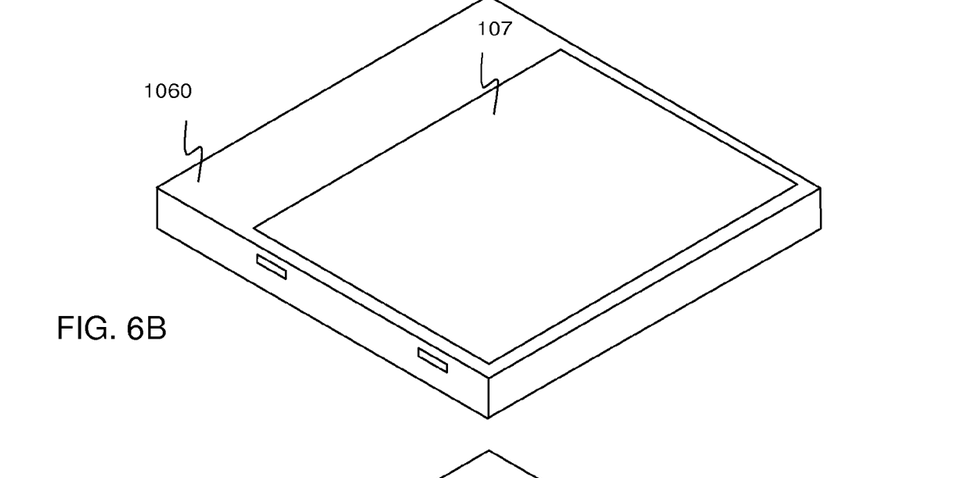

FIG. 6A shows the top view of the semiconductor package according to an embodiment of the present invention, which includes the metal bumps 105a, 105b, 105c with the flat surfaces exposed from the molding layer and FIG. 6B shows the bottom view of the same semiconductor package with the bottom surface of the lower section of the lead frame unit exposed from the molding layer, which may be plated with a metal layer.

Figure 6C:
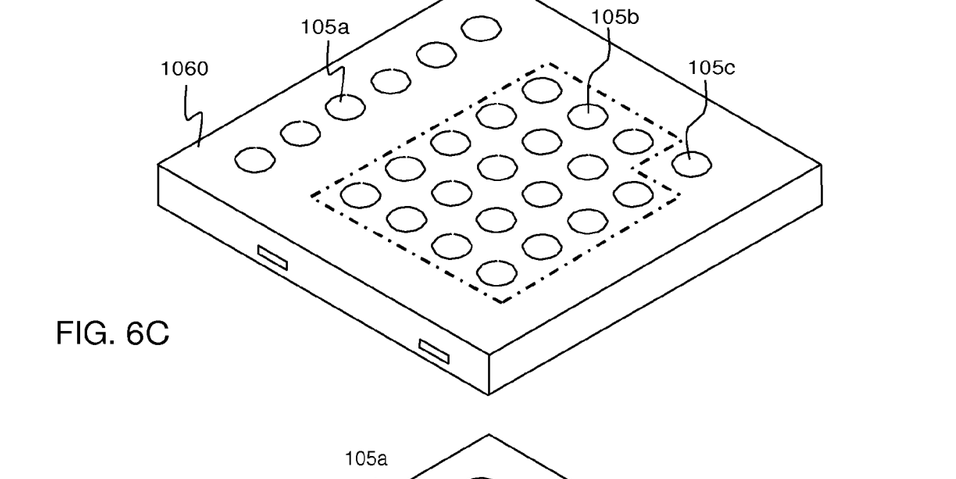
Figure 6D:
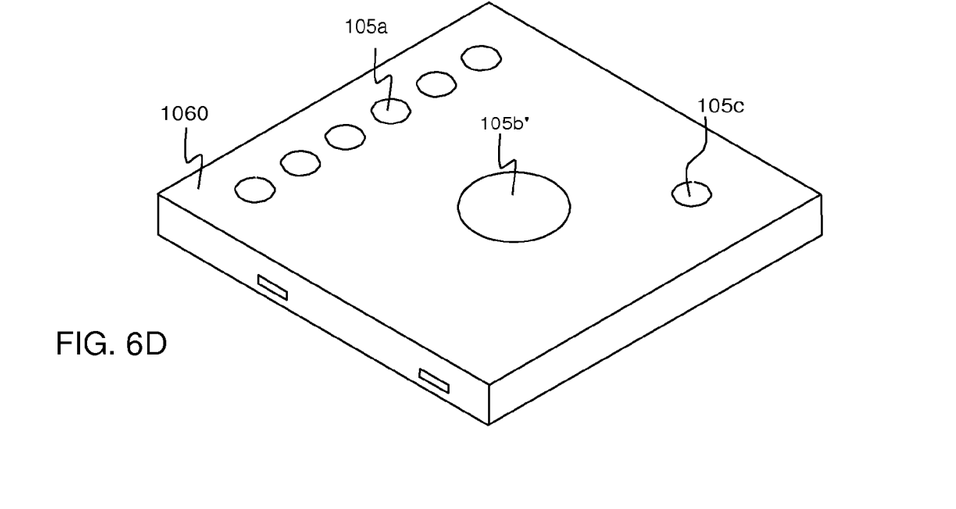

FIG. 6C shows a top view of a semiconductor package according to an alternative embodiment. For a semiconductor device with a large current flowing through the source electrode, more metal bumps 105b may be placed on the source electrode 104b, which will increase the current flow and reduce the on-resistance. FIG. 6D shows another alternative semiconductor package, where a large metal bump 105b' is formed on source electrode 104b, resulting in a larger exposed area, enabling it to carry larger currents and reduce the on-resistance. The semiconductor device shown in FIG. 6D can be formed with a similar method shown in FIGS. 5A-5H, excepting that the density of the metal bumps 105b is increased, such that adjacent metal bumps are placed closer to each other, and in the reflow step, the metal bumps 105b are melted and are merged together forming the metal bump 105b'. In this embodiment, metal bumps 105a on the contact holes 103a also begin to melt but the thin layer 102 prevents them from merging with each other.

In a preferred embodiment as shown in FIG. 5D, the top surface of the upper section 101b of the lead frame unit is coplanar with the top surface of the chip 104, thus the areas of the exposed flat surfaces of the metal bumps 105b and 105a in FIG. 5G are substantially equal, which is easy for butt welding on the standard size pads on the PCB. However, this embodiment does not limit the scope of the present invention. In the present invention, the top surface of the upper section 101b can be slightly higher or lower than the top surface of the chip 104, after the molding step, the top surface of metal bumps 105a, 105b, 105c are ground, as shown in FIG. 5G, and they are coplanar with each other and also with the top surface of the molding layer. In this case, the exposed areas of the metal bumps 105a, 105b, 105c are different, thus the areas of the corresponding contact on the PCB need to be adjusted. Therefore there is a big range for the thickness of the chip 104 or the difference in height between the lower and the upper sections, which cannot be achieved in the prior art manufacturing process.

Comparing with the can structures of the conventional lead frames in FIG. 1A and FIG. 2A, the lead frame unit 101 only includes one extended edge, as such the overall size of the lead frame is reduced for the same size chip. With the manufacturing process of the present invention, the overall thickness of the semiconductor device 1060 is about 0.25 mm to 0.35 mm, thus the semiconductor device is ultra thin and lightweight.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A preparation method of a power semiconductor device, the method comprising the steps of:

providing a lead frame strip comprising a plurality of lead frame units each having a respective staggered structure with a respective upper section and a respective lower section, wherein a respective thin layer is laminated atop a top surface of said each lead frame unit, and wherein the respective thin layer comprises a plurality of contact holes located on the respective upper section and at least one opening located on the respective lower section of said each lead frame unit;

attaching a respective semiconductor chip inside the at least one opening on the respective lower section of said each lead frame unit;

depositing a plurality of metal bumps onto the plurality of contact holes in the respective upper section of said each lead frame unit and onto electrodes on a top surface of the respective semiconductor chip; and cutting the lead frame strip to separate individual lead frame units;

wherein the step of providing the lead frame strip comprising the plurality of lead frame units comprises the sub-steps of:

providing a flat lead frame strip having a flat thin layer laminated on a top surface of the flat lead frame strip, the flat lead frame strip further having a plurality of flat lead frame units, the flat thin layer having a plurality of flat thin layer sections, a respective flat thin layer section of the plurality of flat thin layer sections being on top of each of the flat lead frame units;

selectively etching through the flat thin layer so as to form a plurality of contact holes and at least one opening on the respective flat thin layer section; and punching said each of the flat lead frame units to form a respective staggered structure, wherein a first respective portion with the plurality of contact holes becomes the respective upper section and a second respective portion with the at least one opening becomes the respective lower section.

2. The method of claim 1, wherein the flat thin layer is formed by laminating an aluminum layer on the top surface of the flat lead frame strip.

3. The method of claim 1 further comprising:

forming a molding layer covering the lead frame strip laminated with the flat thin layer, the semiconductor chips, and the plurality of metal bumps after the step of depositing the plurality of metal bumps, wherein a bottom surface of the lower section of said each lead frame unit is exposed from the molding layer;

grinding the molding layer and the plurality of metal bumps so that flat top surfaces of the metal bumps are exposed from a top surface of the ground molding layer; and cutting the lead frame strip and molding layer to separate individual power semiconductor devices.

4. The method of claim 3 further comprising plating a metal layer on the exposed bottom surface of the lower section of said each lead frame unit before the step of grinding the molding layer.

5. The method of claim 3, wherein the flat thin layer is an aluminum film with a layer of aluminum oxide as a passivation layer on a top surface of the aluminum film, and wherein the passivation layer establishes a strong bonding with the molding layer.

6. The method of claim 1, wherein a top surface of the respective upper section of said each lead frame unit is coplanar with the top surface of the respective semiconductor chip.

* * * * *